United States Patent [19]

Gillig et al.

[11] Patent Number: 5,424,689
[45] Date of Patent: Jun. 13, 1995

[54] FILTERING DEVICE FOR USE IN A PHASE LOCKED LOOP CONTROLLER

[75] Inventors: Steven F. Gillig, Roselle; Alexander W. Hietala, Cary, both of Ill.

[73] Assignee: Motorola, Inc., Schaumburg, Ill.

[21] Appl. No.: 172,000

[22] Filed: Dec. 22, 1993

[51] Int. Cl.$^6$ .............................. H03L 7/093
[52] U.S. Cl. .................... 331/17; 331/1 A; 331/10; 331/25
[58] Field of Search ............ 331/1 A, 17, 25, 10, 331/11

[56] References Cited

U.S. PATENT DOCUMENTS

| | | | |
|---|---|---|---|
| 4,167,711 | 9/1979 | Smoot | 331/17 |
| 4,546,330 | 10/1985 | Okada | 331/1 A |
| 4,885,553 | 12/1989 | Hietala et al. | 331/17 |
| 5,095,288 | 3/1992 | Dent | 331/17 |
| 5,142,246 | 8/1992 | Petersson | 331/11 |

Primary Examiner—Siegfried H. Grimm
Attorney, Agent, or Firm—Kirk W. Dailey

[57] ABSTRACT

A phase lock loop (PLL) frequency synthesizer is used in a radiotelephone to provide a reference frequency to a transmitter or a receiver. This particular PLL frequency synthesizer has a wide bandwidth control loop having a high current charge pump (417) and a narrow bandwidth control loop having a low current charge pump (411). A deadzone circuit (413) is used at an output of a phase detector (405) to control the application of an error signal to the high current charge pump (417). Additionally, the PLL frequency synthesizer utilizes a loop filter (419). The loop filter (419) receives two correction signals (409', 415') and provides a single control signal for the VCO (voltage controlled oscillator) (423). The loop filter contains two time constants formed from resistive and capacitive elements. The two time constants control the bandwidth of the two control loops.

9 Claims, 5 Drawing Sheets

FIG. 3 —PRIOR ART—

FILTERING DEVICE FOR USE IN A PHASE LOCKED LOOP CONTROLLER

FIELD OF THE INVENTION

Generally, this invention relates to phase locked loop controllers and, more specifically, to filtering devices for use in phase locked loop (PLL) frequency synthesizers.

BACKGROUND OF THE INVENTION

Phase locked loop (PLL) frequency synthesizers are often used in radiotelephone transmitters to generate a desired frequency for modulating a data signal. The PLL frequency synthesizer having a single phase detector and a single charge pump requires a compromise between fast lock time and good spectral purity. A fast locking control loop often loses lock easily due to outside perturbations. Although the control loop rapidly re-acquires lock, it is inherently unstable, therefore, it does not provide sufficient spectral purity for most applications. Conversely, a slow locking control loop requires a long length of time to acquire frequency lock. In a radiotelephone system such as a TDMA (time division multiple access) radiotelephone system, the PLL frequency synthesizer is required to turn on and turn off. A slow locking loop is insufficient to provide the speed required for the control loop.

In the past, PLL frequency synthesizers have utilized two independent control loops, a wide bandwidth loop to provide the required rapid acquisition lock during initial start up and after the loss of frequency lock and a narrow bandwidth loop for providing stability after the PLL frequency synthesizer has attained lock. One such embodiment which has been developed is illustrated in FIG. 1. Here, the PLL frequency synthesizer utilizes two phase detectors 101, 103 and two charge pumps 105, 107. The phase detector with the deadzone circuit 103, the high current charge pump 107 and the wide band filter 110 together provide a fast locking loop at initial start-up and when re-acquiring lock for the PLL frequency synthesizer. Phase detector without deadzone 101, the low current charge pump 105 and the narrow band filter 111 together are used to provide a stable control loop after the PLL frequency synthesizer has maintained lock. One example of combining the narrow band filter 111 and the wide band filter 110, implemented in the past, is shown in FIG. 2. This loop filter 209 provides a traditional second order loop characteristic for each of the two loops. The loop characteristics can be set independently.

It would be advantageous to provide a PLL frequency synthesizer which provides higher order loop characteristics for both the wide bandwidth and narrow bandwidth control loops. Additionally, it would be advantageous to provide a PLL frequency synthesizer which utilizes fewer parts for implementing.

DESCRIPTION OF THE PREFERRED EMBODIMENT

Figure 1:
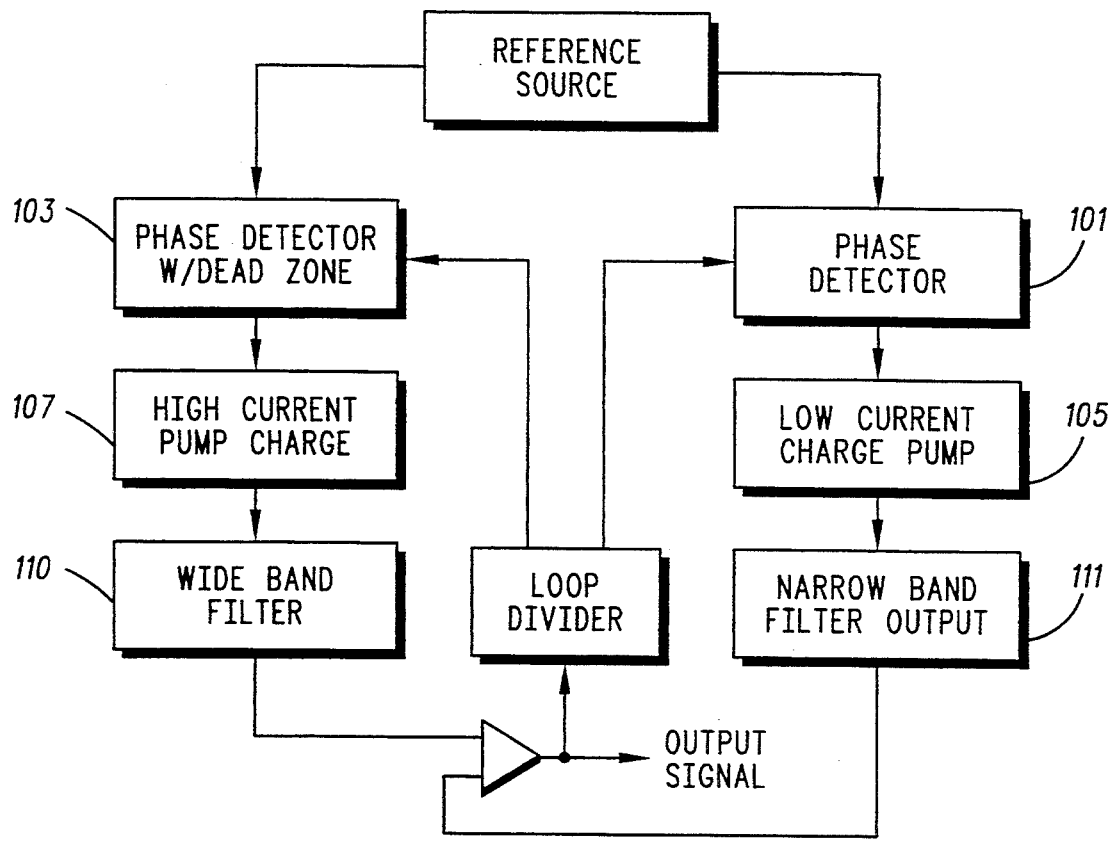
FIG. 1 is an illustration in block diagram form of a PLL frequency synthesizer that is prior art.
Figure 2:
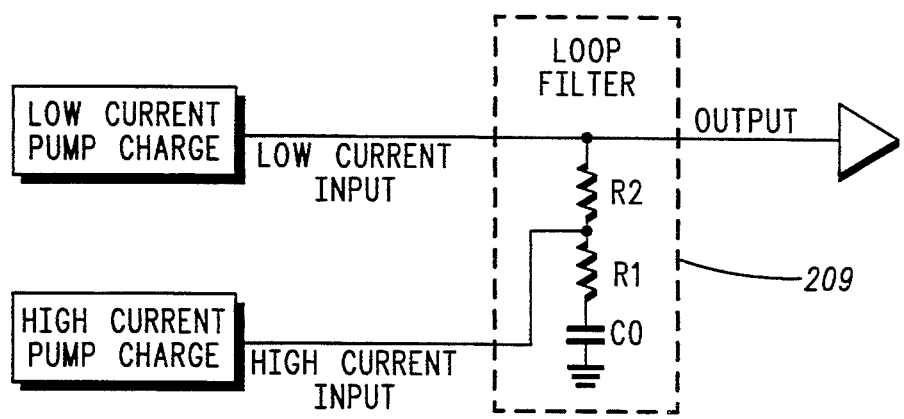
FIG. 2 is an illustration of a loop filter that is prior art.
Figure 3:
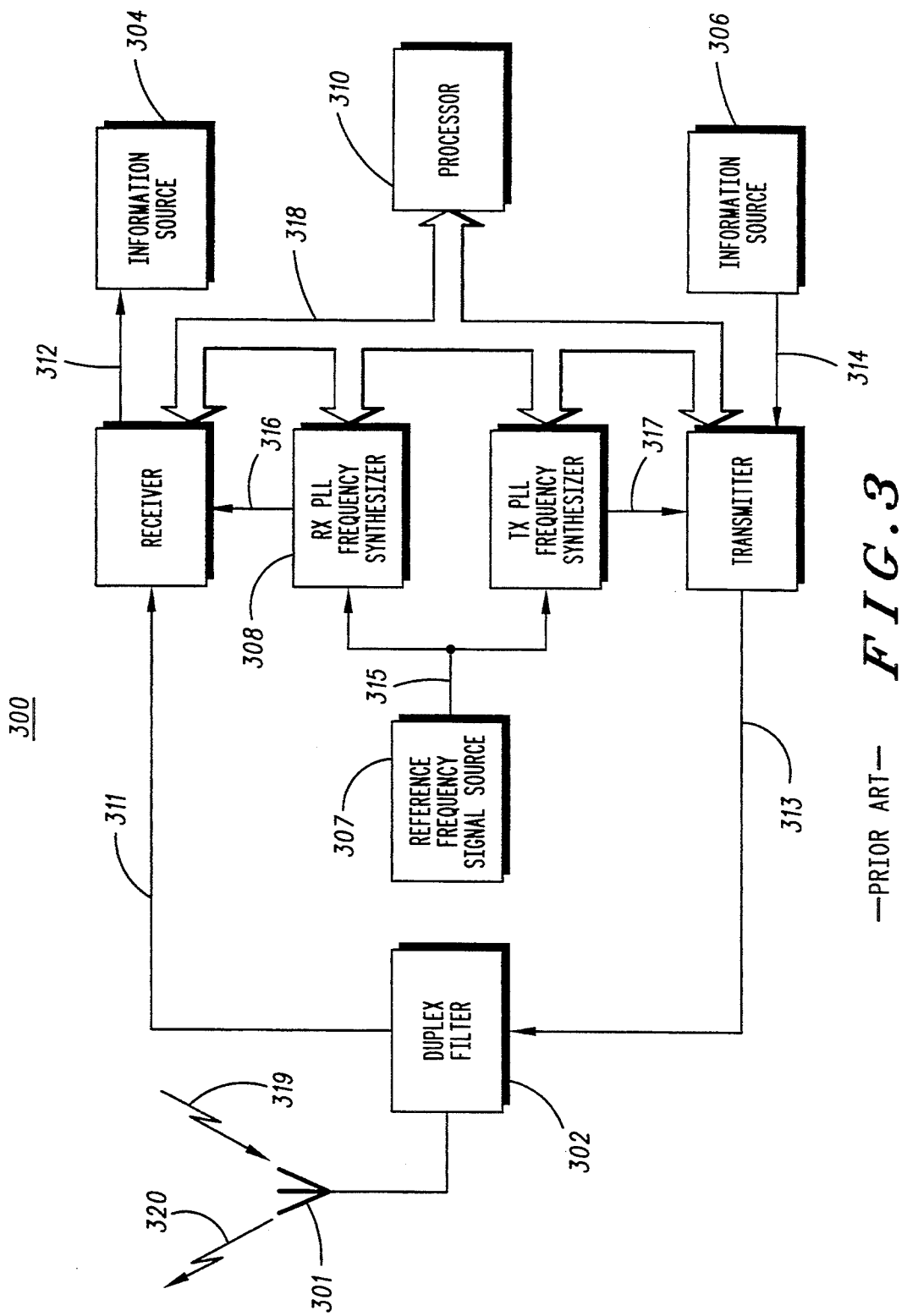
FIG. 3 is an illustration in block diagram form of a radio communication system that is prior art.

FIG. 3 illustrates, by example, a block diagram of a conventional radio communication transceiver 300 (hereinafter referred to as "transceiver"). The transceiver 300 enables a mobile or portable subscriber unit to communicate with a base station (not shown), for example, over radio frequency (RF) channels in a radio communication system (not shown). The base station thereafter provides communications with a landline telephone system (not shown) and other subscriber units. An example of a subscriber unit having the transceiver 300 is a cellular radiotelephone.

The transceiver 300 of FIG. 3 generally includes an antenna 301, a duplex filter 302, a receiver 303, a transmitter 305, a reference frequency signal source 307, a receive (Rx) phase locked loop (PLL) frequency synthesizer 308, a transmit (Tx) PLL frequency synthesizer 309, a processor 310, an information source 306, and an information sink 304.

The interconnection of the blocks of the transceiver 300 and operation thereof is described as follows. The antenna 301 receives a RF signal 319 from the base station for filtering by the duplex filter 302 to produce an RF received signal at line 311. The duplex filter 302 provides frequency selectivity to separate the RF received signal at line 311 and the RF transmit signal at line 313. The receiver 303 is coupled to receive the RF received signal at line 311 and operative to produce a received baseband signal at line 312 for the information sink 304. The reference frequency signal source 307 provides a reference frequency signal at line 315. The Rx PLL frequency synthesizer 308 is coupled to receive the reference frequency signal at line 315 and information on a data bus 318 and operative to produce a receiver tune signal at line 316 to tune the receiver 303 to a particular RF channel. Likewise, the Tx PLL frequency synthesizer 309 is coupled to receive the reference frequency signal at line 315 and information on the data bus 318 and operative to produce a transceiver tune signal at line 317 to tune the transmitter 305 to a particular RF channel. The processor 310 controls the operation of the Rx PLL frequency synthesizer 308, the Tx PLL frequency synthesizer 309, the receiver 303, and the transmitter 305 via the data bus 318. The information source 306 produces a baseband transmit signal at line 314. The transmitter 305 is coupled to receive the baseband transmit signal at line 314 and operative to produce the RF transmit signal at line 313. The duplex filter 302 filters the RF transmit signal at line 313 for radiation by the antenna 301 as a RF signal 320.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the landline telephone system. In cellular radiotelephone systems capable of transceiving wide band data on the signaling channels, the frequency spacing of the signaling channels may be a multiple of the frequency spacing of the voice channels.

In some cellular radiotelephone systems, the transceiver 300 and the base station intermittently transceive information therebetween on the signaling channel. One such system, for example, uses a time division multiple access (TDMA) signaling method to synchronize the intermittent information. In this type of system, keeping the transceiver 300 fully powered during the entire time that the transceiver 300 is tuned to the signaling channel unnecessarily drains the transceiver's battery during those times when the information is not received. Therefore, portions of the transceiver 300 can be powered off to prolong battery life when the transceiver is not transceiving information. Further, portions of the transceiver 300 can be powered off to prolong battery life when the signal quality is good enough such that further repetition of the same information is not needed. Intermittently powering on and off, i.e. enabling and disabling, the transceiver 300 during its receive operation is called discontinuous receive (DRX) mode of operation. In the DRX mode of operation, quickly enabling and disabling the portions of the transceiver 300 produces the greatest savings in battery life.

Figure 4:
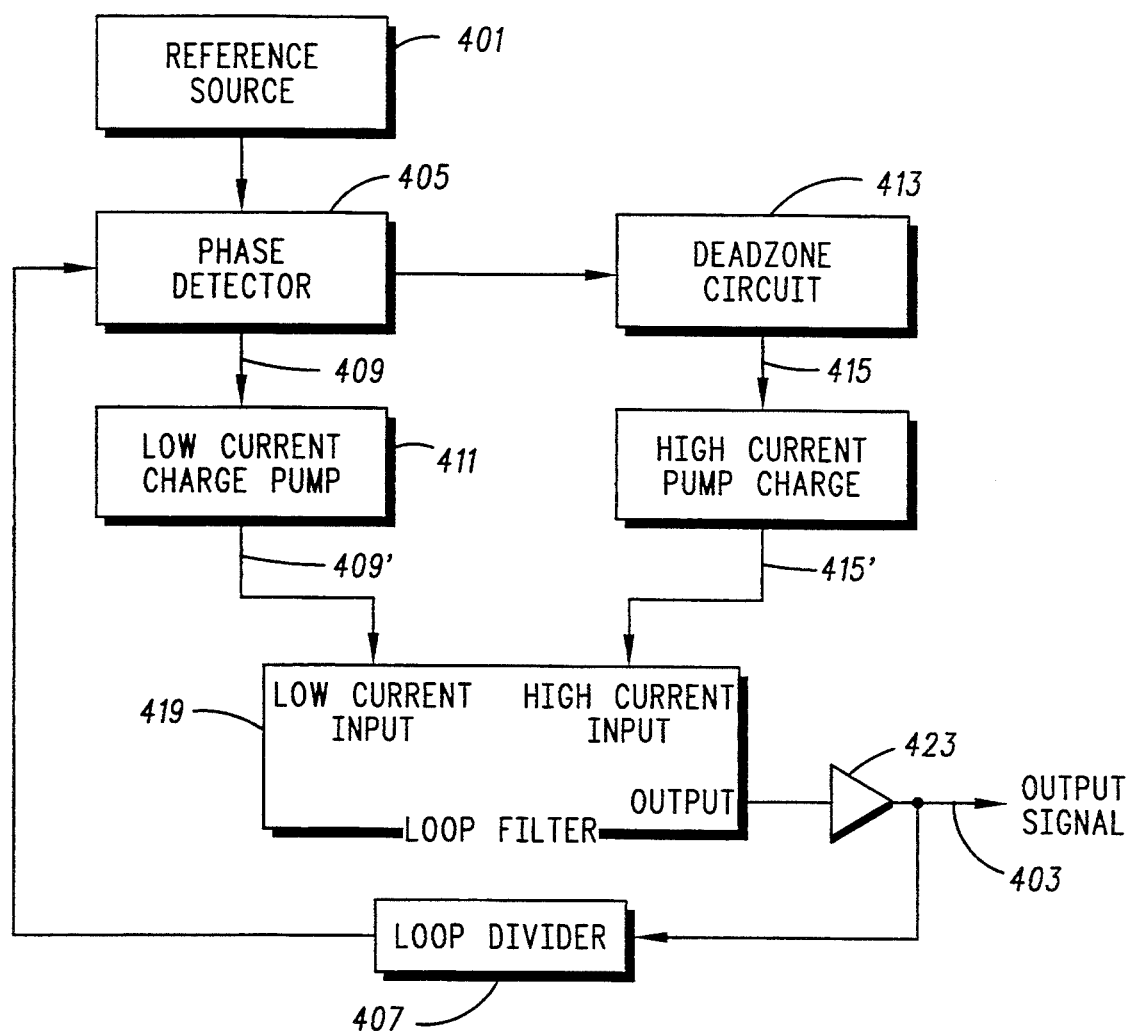
FIG. 4 is an illustration in block diagram form of a PLL frequency synthesizer in accordance with the present invention.

FIG. 4 is an illustration in block diagram form of a phase locked loop frequency synthesizer in accordance with the preferred embodiment of the present invention. A PLL frequency synthesizer is one type of a family of phase locked loop controllers, which includes phase locked phase shifters. The PLL frequency synthesizer utilizes a reference source 401 to provide an output signal 403 which has a predetermined frequency. The reference source 401 provides a stable frequency signal to a phase detector 405. A second input of the phase detector 405 is coupled to an output of a loop divider 407. The phase detector 405 generates a correction signal equal to a phase difference between the first input signal phase and the second input signal phase. The correction signal 409 is coupled to a low current charge pump 411 and a deadzone circuit 413. The deadzone circuit 413 produces a second correction signal 415 that has a deadzone around zero phase; details concerning the deadzone circuit will be provided below. A high current charge pump 417 accepts the second correction signal 415. The first and the second charge correction signals 409', 415' are input into a loop filter 419. The loop filter 419 includes a first filtering apparatus and a second filtering apparatus; details concerning the loop filter will be discussed below. The loop filter 419 generates a control signal 421. The control signal 421 is input into a voltage controlled oscillator (VCO) 423. The VCO 423 generates a synthesized frequency output signal 403 having a desired frequency. The synthesized frequency output signal 403 is output from the PLL frequency synthesizer for use by a radio frequency transmitter or a radio frequency receiver. Additionally, the frequency synthesized output signal is applied to a loop divider 407. The loop divider 407 divides the predetermined frequency down for comparison to the reference source 401 in the phase detector 405.

At the beginning of a frequency acquisition sequence, the loop divider 407 is programmed to a new value and the loop tries to acquire lock to the new frequency. This change in the loop divider causes the phase detector 405 to generate a large error signal 409. The large error signal 409 is recognized by the deadzone circuit 413, allowing the error signal 409 to pass substantially unaltered through the deadzone circuit to the high current charge pump 417. Now both the low current charge pump 411 and the high current charge pump 417 are active and appropriately fed to the multiple input loop filter 419, producing an overall wide bandwidth loop characteristic. The loop rapidly approaches a condition of frequency lock with zero phase error. As the loop approaches zero phase error, the error signal 409 output from the phase detector 405 decreases in magnitude significantly. This decrease is recognized by the deadzone circuit 413, consequently, the correction signal 415 generated by the deadzone circuit 413 is significantly decreased, causing a decrease in the high current charge pump's correction signal 415'. Eventually, only the low current charge pump 411 is generating a correction signal 409' and the high current charge pump 417 is no longer active. Once the high current charge pump 417 is inactive, the loop takes on a new narrow bandwidth characteristic. The narrow bandwidth loop characteristic provides high stability during a frequency lock situation, such that the output signal 403 is not easily changed due to perturbations from outside interferences.

Figure 5:
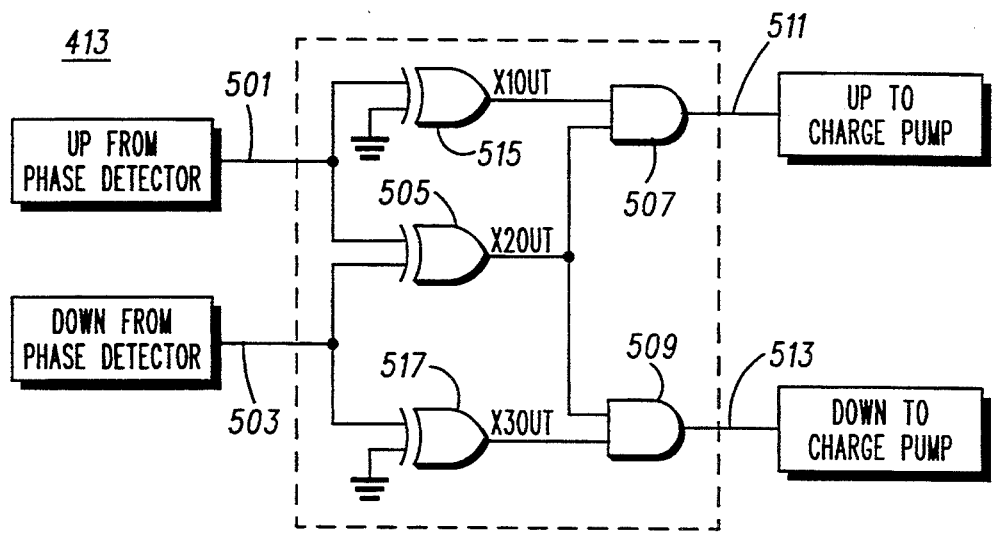
FIG. 5 is a detailed illustration of a deadzone block in accordance with the present invention.
Figure 6:
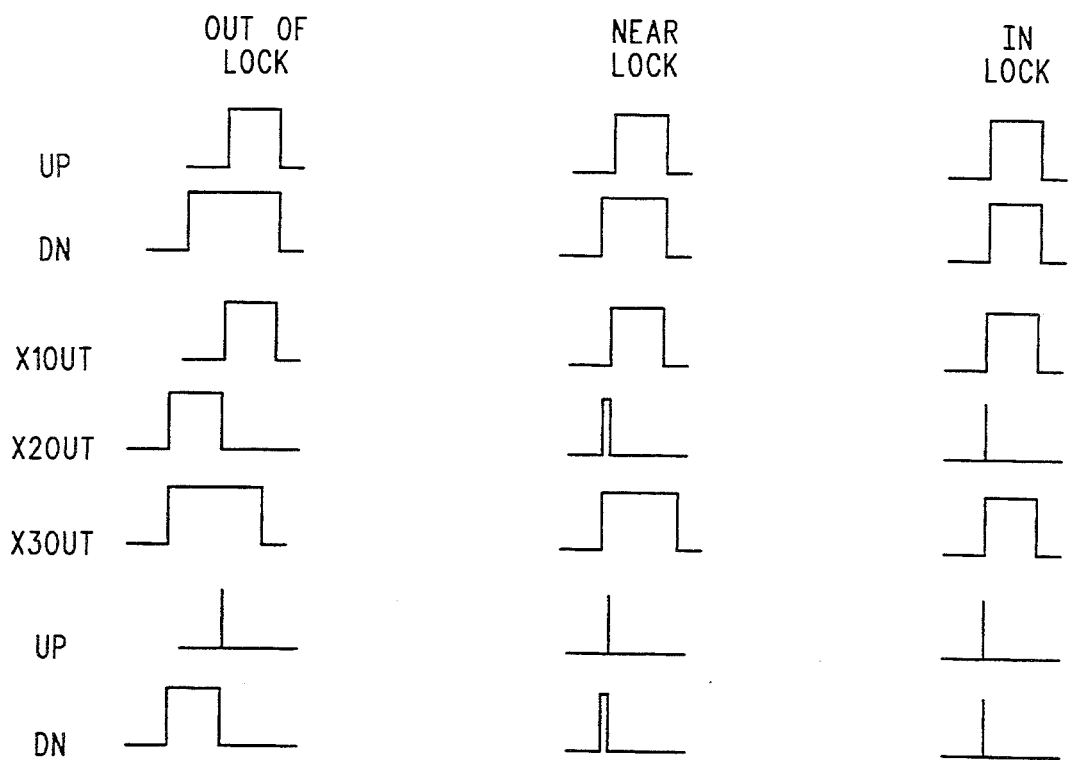
FIG. 6 is a timing diagram in accordance with the deadzone block of FIG. 4.

FIG. 5 is a detailed illustration of a deadzone circuit used in the preferred embodiment. This deadzone circuit would be used with a tri-state phase detector. The error signal 409, output from the phase detector 405, consists of up and down pulses as indicated in FIG. 5. The width of the error pulses are proportional to the phase difference between the inputs of the phase detector 105 The up pulse indicates that the charge pump should force the VCO frequency to increase and the down pulse 503 indicates that charge pump should force the VCO 423 frequency to decrease. When the PLL frequency synthesizer is in lock, the up pulse width and the down pulse width are identical and coincident in time. Therefore, the output of the exclusive OR gate 505 is zero volts or, at most, an extremely narrow pulse, as shown in FIG. 6. Since the output of the exclusive OR gate 505 is zero, the output of the AND gates 507, 509 are also zero. The up output signal 511 and the down output signal 513 make up the second correction signal 415 as indicated in FIG. 4. When an in lock situation exists, the up output signal 511 and the down output signal 513 are at zero volts and will cause the high current charge pump 417 to tri-state. The second and third exclusive OR gates 515, 517 provide a delay to the up input signal 501 and the down input signal 503 respectively to provide equal gate delays to the AND gates 507, 509. When an out of lock condition exists, a portion of the up input signal 501 and the down input signal 503 overlap and that portion is eliminated in the center exclusive OR gate 505. The remaining portion of the signals that do not overlap, passes through the center exclusive OR gate 505 and onto the AND gates 507, 509. The signal at the output of the center exclusive OR gate 505 is allowed to pass to the output of the appropriate AND gate and onto the high current charge pump 417. During the intermediate state of near lock, the pulse width that is allowed to reach the high current charge pump 417 is very narrow. Since the high current charge pump 417 has a finite turn on and turn off time, the charge pump 417 output correction signal 415' will not reach its full current value. A reduced gain zone then arises which leads to a loop characteristic which is somewhere between the wide and narrow modes previously discussed.

Figure 7:
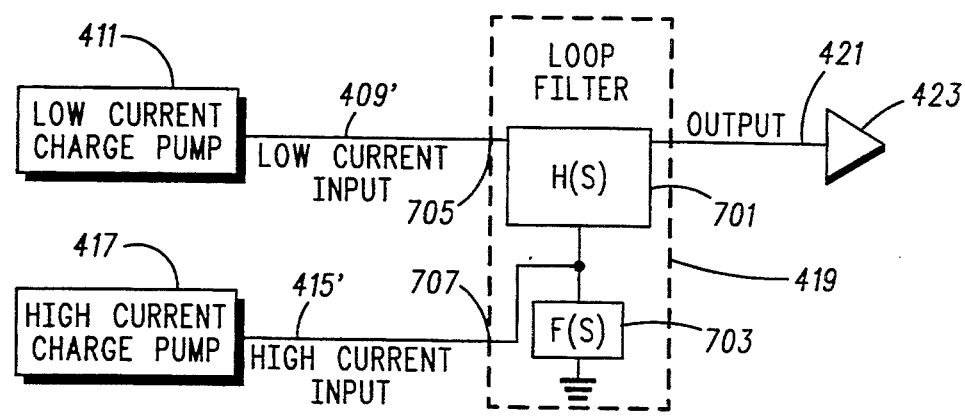
FIG. 7 is an illustration in block diagram form of a loop filter in accordance with the present invention.

A particular implementation of the loop filter 419 is illustrated in FIG. 7. The loop filter 419 has two filtering apparatus 701, 703 that are represented by transfer functions represented by H(s) and F(s), respectively. The first correction signal 409' is input to the first filtering apparatus H(s) through the low current input 705. In the preferred embodiment, the first correction signal 409' is also directly connected to the control signal 421 output from the loop filter 419. The second correction signal 415' is input through the high current input 707 and coupled to a second port on the first filtering apparatus 701 and a first port of the second filtering apparatus 703, represented by F(s). The second filtering apparatus 703 forms substantially the wide bandwidth portion of the loop filter. The first filtering apparatus 701 forms a part of the narrow bandwidth portion of the loop filter.

During the wide bandwidth lock acquisition period, the first filtering apparatus 701 of the narrow loop filter is essentially bootstrapped by the rapid signal change produced by the combination of the second filtering apparatus 703 and the high current charge pump 417. During the acquisition period, the first filtering apparatus 701 sees a very high impedance presented by the parallel combination of the low current charge pump 411 and the VCO 423. The output control signal 421 undergoes a rapid signal change and the VCO 423 is quickly driven to the new frequency. Due to the bootstrap effect, the voltage across the first filtering apparatus 701 remains nearly constant and the relatively long time constant associated with it is not a factor. Upon approaching a zero phase error condition, the deadzone circuit 413 of FIG. 4 passes an ever decreasing output to the high current charge pump 417. The high impedance and reduced output from the high charge pump 417 leaves the low current charge pump 411 and the combination of the first and the second filtering apparatus 701, 703 to produce an overall narrow loop filter characteristic. By appropriately choosing the current of the low current charge pump 411 and the high current charge pump 417 and the values for the first filtering apparatus 701 and the second filtering apparatus 703, the loop characteristics of the wide and narrow modes can be made substantially independent, and a seamless transition can be made from a wide to a narrow loop characteristic. Further, the loop can be made so as to produce an optimal trade-off between fast lock and good spectral purity that is better in both respects than can be achieved by the PLL frequency synthesizers of the prior art.

Figure 8:
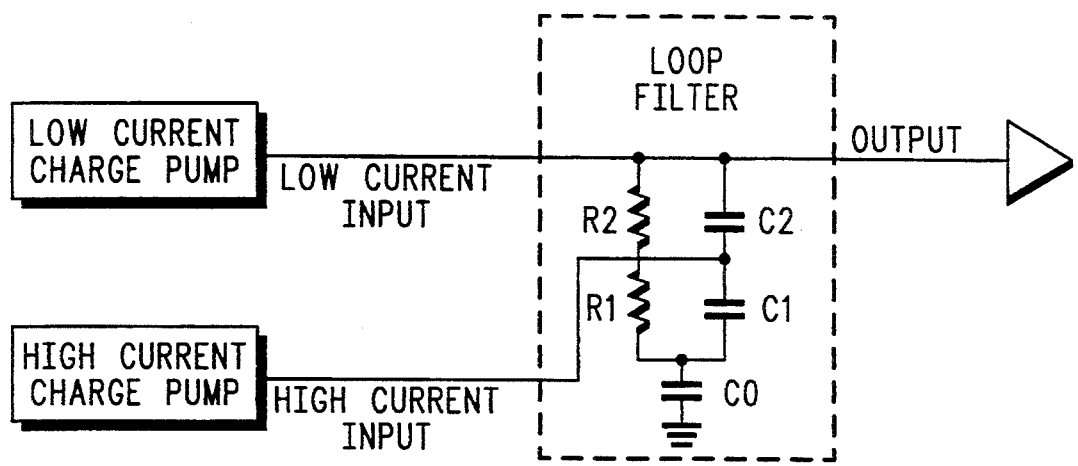
FIG. 8 is a detailed illustration of a loop filter in accordance with the present invention.

FIG. 8 is a detailed illustration of the loop filter of FIG. 4. The first filtering apparatus contains a resistive element R2 and forms a first time constant with capacitor C2. The second filtering apparatus contains a resistive element R1 and a forms a second time constant with capacitors C1 and C0, wherein the first time constant is greater than the second time constant. This implementation gives an overall third order characteristic to the loop in both the initial wide band and the final narrow band modes. Additional time constants formed from resistive and capacitive elements may be added to provide higher order and better spectral purity, as may be required by the design.

What is claimed is:

1. A filtering device for use in a phase locked loop controller of a signal generator, the controller having a first loop and a second loop, the first loop having a first loop bandwidth and a first correction signal, the second loop having a second loop bandwidth and a second correction signal, the filtering device comprising:
   a first filtering apparatus including a first time constant, a first port, a second port, and a third port, the first port coupled to the first correction signal, the second port coupled to a control input of the signal generator; and
   a second filtering apparatus including a second time constant and a first port, the first port coupled to the third port of the first filtering apparatus and the second correction signal, wherein the first loop bandwidth is dependent upon the first time constant and the second time constant, and the second loop bandwidth is dependent upon the second time constant.

2. A filtering device in accordance with claim 1 wherein the second filtering apparatus includes a second port, the second port coupled to an electrical ground.

3. A filtering device in accordance with claim 1 wherein the first port and the second port of the first filtering apparatus are directly coupled.

4. A filtering device in accordance with claim 1 wherein the first time constant is greater than the second time constant.

5. A phase locked loop controller for controlling a signal generator comprising:
   a filtering device for generating a control signal, the control signal input to the signal generator, the filtering device comprising:
     a first time constant dependent upon a first capacitive element, and
     a second time constant dependent upon a second capacitive element,
     the second time constant less than the first time constant;
   a first loop including a first loop bandwidth and a first correction signal, the first correction signal coupled to the filtering device, the first loop bandwidth dependent upon the first time constant and the second time constant; and
   a second loop including a second loop bandwidth and a second correction signal, the second correction signal coupled to the filtering device, the second loop bandwidth dependent upon the second time constant.

6. A phase locked loop controller in accordance with claim 5 wherein the first loop bandwidth is less than the reciprocal of the first time constant.

7. A phase locked loop controller in accordance with claim 6 wherein the second loop bandwidth is greater than the reciprocal of the first time constant.

8. A phase locked loop (PLL) frequency synthesizer comprising:
   a reference source providing a reference frequency signal;
   a phase detector having a first input, a second input and a first output, the first input coupled to the reference frequency signal, the first output providing a first correction signal;
   a deadzone circuit having a first input and a first output, the first input coupled to the first correction signal, the first output providing a second correction signal;

a filtering device comprising:
- a first filtering apparatus including a first time constant, a first port, a second port, and a third port, the first port coupled to the first correction signal; and
- a second filtering apparatus including a second time constant and a first port, the first port coupled to the third port of the first filtering apparatus and the second correction signal;

a voltage controlled oscillator having a first control input and a first output, the first control input coupled to the second port of the first filtering apparatus, the first output providing a synthesized frequency signal and coupled to the second input of the phase detector.

9. A filtering device for use in a phase locked loop controller of a signal generator, the controller having a first loop and a second loop, the first loop having a first loop bandwidth and a first correction signal, the second loop having a second loop bandwidth and a second correction signal, the filtering device comprising:
- a first filtering apparatus including a first resistor and a first capacitor forming a first time constant, a first end of the first resistor and a first end of the first capacitor coupled to the first correction signal and a control input of the signal generator; and
- a second filtering apparatus including a second resistor and a second capacitor forming a second time constant, a first end of the second resistor and a first end of the second capacitor coupled to the second correction signal, a second end of the first resistor and a second end of the first capacitor, a second end of the second resistor and a second end of a second capacitor coupled to an electrical ground, wherein the first loop bandwidth is dependent upon the first time constant and the second time constant, and the second loop bandwidth is dependent upon the second time constant.

* * * * *